(12) United States Patent
Hong et al.

(10) Patent No.: US 8,258,692 B2
(45) Date of Patent: Sep. 4, 2012

(54) ORGANIC LIGHT EMITTING DIODE DISPLAY AND METHOD FOR MANUFACTURING THE SAME

(75) Inventors: Sang-Mok Hong, Yongin (KR); Zail Lhee, Yongin (KR); Keun-Soo Lee, Yongin (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 114 days.

(21) Appl. No.: 12/541,275

(22) Filed: Aug. 14, 2009

(65) Prior Publication Data

US 2010/0044691 A1 Feb. 25, 2010

(30) Foreign Application Priority Data

Aug. 20, 2008 (KR) .................. 10-2008-0081235

(51) Int. Cl.
*H01J 1/62* (2006.01)
(52) U.S. Cl. ........... 313/506; 313/504; 313/505; 445/24
(58) Field of Classification Search .......... 313/498–512; 445/24
See application file for complete search history.

(56) References Cited

U.S. PATENT DOCUMENTS

| | | |
|---|---|---|
| 2005/0269962 A1 | 12/2005 | Matsunaga |
| 2007/0096637 A1 * | 5/2007 | Kim .............................. 313/503 |
| 2007/0120476 A1 * | 5/2007 | Park et al. ..................... 313/506 |
| 2008/0142807 A1 * | 6/2008 | Choe et al. ...................... 257/72 |
| 2009/0061720 A1 | 3/2009 | Fujimaki |

FOREIGN PATENT DOCUMENTS

| | | |
|---|---|---|
| JP | 62-287596 | 12/1987 |
| JP | 2001-244073 | 9/2001 |
| JP | 2002-164167 | 6/2002 |
| JP | 2002-208480 | 7/2002 |
| JP | 2003-178871 | 6/2003 |
| JP | 2003-233329 | 8/2003 |
| JP | 2005-276600 | 10/2005 |
| JP | 2006-502545 | 1/2006 |
| JP | 2006-049125 | 2/2006 |
| JP | 2006-171739 | 6/2006 |
| JP | 2006-294454 | 10/2006 |
| JP | 2006-323032 | 11/2006 |
| JP | 2007-157659 | 6/2007 |
| JP | 2008-123986 | 5/2008 |
| KR | 10-00667089 | 1/2007 |
| KR | 10-0720142 | 5/2007 |
| KR | 10-2009-0025145 | 3/2009 |

OTHER PUBLICATIONS

European Search Report dated Nov. 30, 2009, in corresponding European Patent Application No. 09167904.3.

* cited by examiner

*Primary Examiner* — Bumsuk Won
(74) *Attorney, Agent, or Firm* — Robert E. Bushnell, Esq.

(57) ABSTRACT

Aspects of the present invention relate to an organic light emitting diode (OLED) display and a manufacturing method thereof. The OLED display includes: a substrate; pixel electrodes disposed on the substrate; a pixel defining layer disposed on the substrate, having a plurality of openings that expose the pixel electrodes; an organic emission layer formed on the pixel electrodes; and a common electrode formed on the organic emission layer and the pixel defining layer. An electrode cut is formed in the common electrode, around one of the openings of the pixel defining layer, to electrically isolate a portion of the common electrode.

19 Claims, 4 Drawing Sheets

ORGANIC LIGHT EMITTING DIODE DISPLAY AND METHOD FOR MANUFACTURING THE SAME

CROSS-REFERENCE TO RELATED APPLICATION

This application claims the benefit of Korean Patent Application No. 2008-81235, filed in the Korean Intellectual Property Office on Aug. 20, 2008, disclosure of which is incorporated herein, by reference.

BACKGROUND OF THE INVENTION

1. Field of the Invention

Aspects of the present invention relate to an organic light emitting diode (OLED) display and a method of manufacturing the same.

2. Description of the Related Art

An OLED display includes organic light emitting diodes (OLEDs) that emit light. Light is emitted when excitons, which are generated when electrons and holes are combined, drop from an excited state to a ground state. An OLED display produces an image using the generated light.

Accordingly, an OLED display has self-luminance characteristics, and compared to a liquid crystal display (LCD), the thickness and a weight thereof can be reduced, since a separate light resource is not required. Further, because an OLED display has a low power consumption, a high luminance, and a high reaction speed, it is ideally suited for use in a mobile electronic device.

An OLED display displays an image using a plurality of pixels, and an OLED is included in each pixel. In general, an OLED includes an organic emission layer, a hole injection electrode, and an electron injection electrode. When a current is supplied to the hole injection electrode and the electron injection, the organic emission layer emits light.

However, a bright spot failure may occur in some pixels, during manufacturing. A bright spot failure refers to a state in which an OLED continuously emits light, without regard to a data signal and a gate signal. As described, a pixel that always emits light, due to a bright spot failure, can be easily detected by a user, as a bright spot in an image. That is, the occurrence of a bright spot failure reduces the quality of an OLED display.

Conventionally, when an OLED display is manufactured with a pixel having a bright spot failure, the pixel is deactivated using a laser. However, such repair process may damage peripheral data lines, common lines, and/or other electrodes.

SUMMARY OF THE INVENTION

Aspects of the present invention provide an organic light emitting diode (OLED) display that facilitates the repair of a bright spot failure, and a method of manufacturing the OLED display.

An OLED display, according to an exemplary embodiment of the present invention, includes: a substrate including a plurality of pixel areas; a pixel electrode disposed in each pixel area; a pixel defining layer formed on the substrate, having a plurality of openings that respectively expose the pixel electrodes; an organic emission layer formed on the pixel electrodes; and a common electrode formed on the organic emission layer and the pixel defining layer. An electrode cut is formed in the common electrode, to electrically isolate a portion of the common electrode.

According to an exemplary embodiment of the present invention, the electrode cut may be formed on the pixel defining layer. The pixel defining layer may include a channel formed along the electrode cut. The pixel defining layer may be interposed between the electrode cut and the pixel electrode.

According to an exemplary embodiment of the present invention, the OLED display may further include a data line, a common power line, a source electrode, and a drain electrode. At least one of the data line, the common power line, the source electrode, and the drain electrode may be disposed under the electrode cut.

According to an exemplary embodiment of the present invention, an organic emission layer, in the pixel area where the electrode cut is formed, may not emit light. The organic emission layer may be formed between the pixel defining layer and the common electrode, and an organic layer cut may be formed by cutting the organic emission layer along the electrode cut.

A manufacturing method of an OLED display, according to another exemplary embodiment of the present invention, includes: forming a pixel electrode in each pixel area of a substrate; forming a pixel defining layer on the substrate, having a plurality of openings that respectively expose the pixel electrodes; forming an organic emission layer on the pixel electrode; completing a plurality of OLEDs, by forming a common electrode on the organic emission layer; searching for a defective OLED; and forming an electrode cut, by cutting the common electrode in a pixel electrode corresponding to the defective OLED. The electrode cut may surround a corresponding opening of the pixel defining layer.

According to an exemplary embodiment of the present invention, the electrode cut may be formed on the pixel defining layer. The forming of the electrode cut may include forming a channel in the pixel defining layer, which is disposed under the electrode cut. The pixel defining layer may be interposed between the electrode cut and the pixel electrode.

According to an exemplary embodiment of the present invention, the manufacturing method further include forming a data line, a common power line, a source electrode, and a drain electrode. At least one of the data line, the common power line, the source electrode, and the drain electrode may be disposed under the electrode cut.

According to an exemplary embodiment of the present invention, an organic emission layer is formed in a pixel area corresponding to the electrode cut. The organic emission layer may not emit light.

According to an exemplary embodiment of the present invention, the manufacturing method further include forming the organic emission layer between the pixel defining layer and the common electrode. The forming of the electrode cut may include forming an organic layer cut, together with the electrode cut, by cutting the organic emission layer along the electrode cut.

According to the present invention, a bright spot failure of the OLED display can be stably changed to a black spot, thereby improving display quality.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the exemplary embodiments, taken in conjunction with the accompanying drawings, of which.

DETAILED DESCRIPTION OF THE EXEMPLARY EMBODIMENTS

Figure 1:
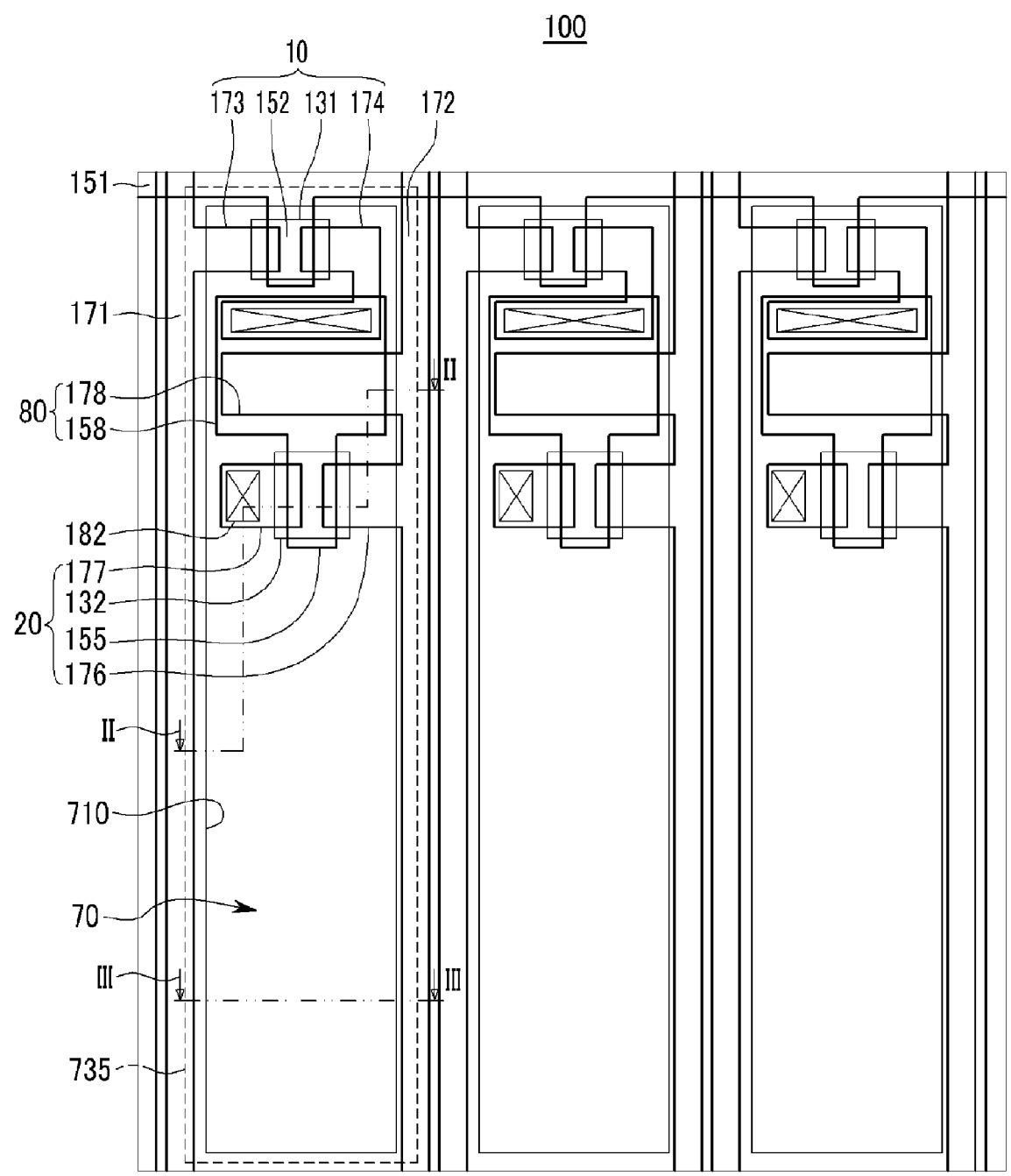
FIG. 1 is a layout view of an organic light emitting diode (OLED) display, according to a first exemplary embodiment of the present invention.

Reference will now be made in detail to the exemplary embodiments of the present invention, examples of which are illustrated in the accompanying drawings, wherein like reference numerals refer to the like elements throughout. The exemplary embodiments are described below, in order to explain the aspects of the present invention, by referring to the figures. In the drawings, the thickness of various layers, films, panels, regions, etc., are exaggerated for clarity.

It will be understood that when an element, such as a layer, film, region, or substrate is referred to as being formed or disposed on another element, it can be directly on the other element, or intervening elements may also be present. In contrast, when an element is referred to as being formed or disposed directly on another element, there are no intervening elements present.

In the accompanying drawings, an organic light emitting diode (OLED) display is illustrated as an active matrix (AM)-type OLED display having a 2Tr-1 Cap structure, in which two thin film transistors (TFTs) and one capacitor are formed in one pixel, but the present invention is not limited thereto. Therefore, the OLED display can have various structures. For example, three or more TFTs and two or more capacitors can be provided in one pixel of the OLED display, and separate wires can be further provided in the OLED display. Herein, a pixel area refers to an area where a pixel is formed. A pixel refers to a minimum unit for displaying an image, and the OLED display displays an image by using a plurality of pixels.

Figure 2:
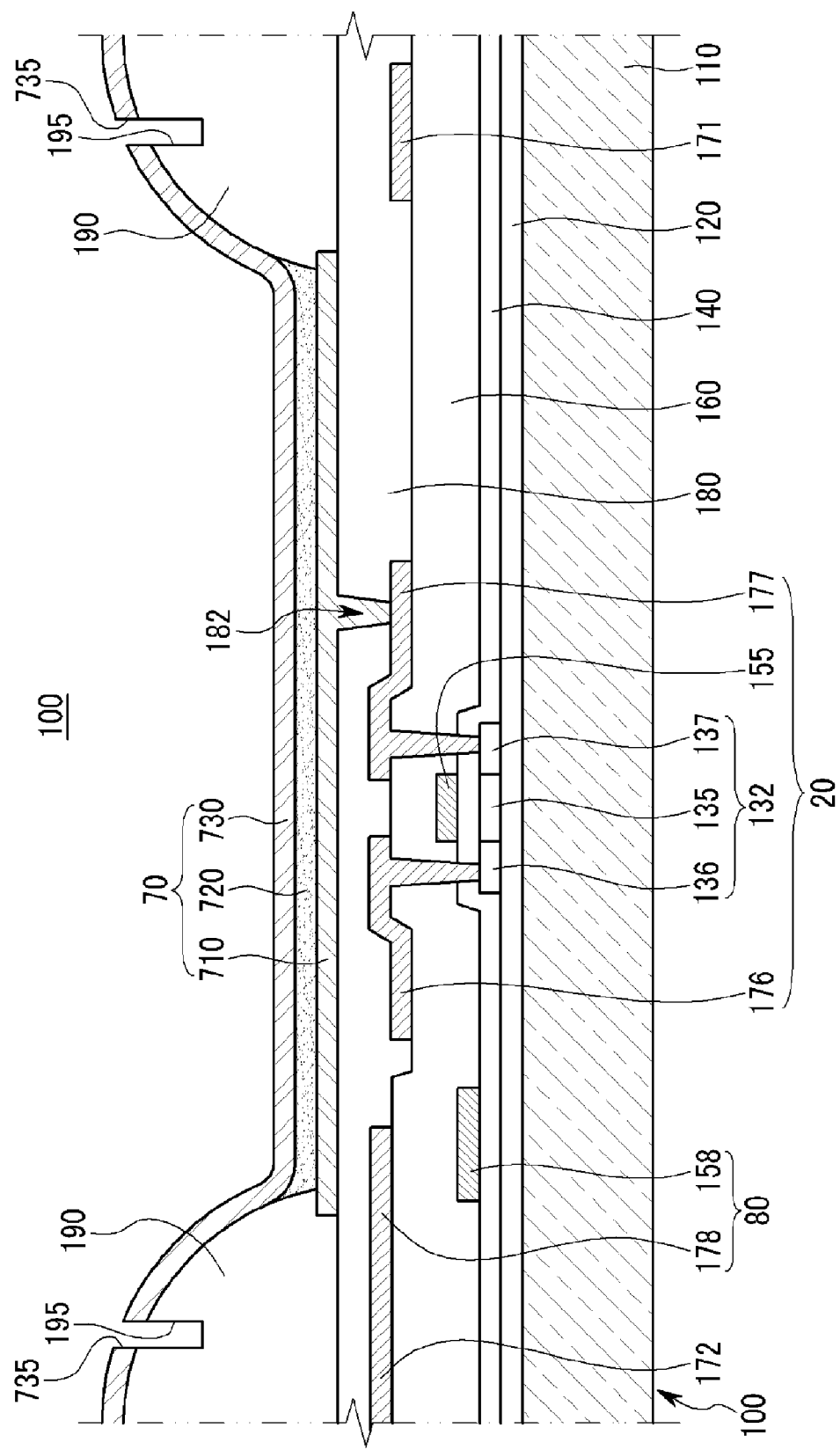
FIG. 2 is a cross-sectional view taken along the line II-II of FIG. 1.

With reference to FIG. 1 and FIG. 2, a first exemplary embodiment of the present invention will be described in further detail. As shown in FIG. 1 and FIG. 2, an organic light emitting diode (OLED) display 100 includes a plurality of pixel areas. The OLED display 100 includes a switching thin film transistor 10, a driving thin film transistor 20, a capacitor 80, and an OLED 70, in each pixel area.

The OLED display 100 further includes gate lines 151, and data lines 171 and a common power line 172 that respectively cross and are insulated from the gate lines 151. Here, the pixel areas are bound by the data lines 151, the data lines 171, and the common power line 172. Although not shown, the OLED display 100 may further include a sealing member to seal the thin film transistors 10 and 20, the capacitors 80, and the OLEDs 70.

Each OLED 70 includes a pixel electrode 710, an organic emission layer 720 formed on the pixel electrode 710, and a portion of a common (transflective) electrode 730, which is formed on the organic emission layer 720. The pixel electrode 710 becomes a positive electrode (a hole injection electrode), and the transflective common electrode 730 becomes a negative electrode (a electron injection electrode). However, the present invention is not limited thereto and, according to a driving method of the OLED display 100, the pixel electrode 710 may become the negative electrode, and the common electrode 730 may become the positive electrode. Holes and electrons are injected into the organic emission layer 720, from the pixel electrode 710 and the common electrode 730, respectively. Excitons are formed by coupling the injected holes and electrons. When the excitons drop from an excited state to a ground state, light is emitted.

The switching thin film transistor 10 includes a switching semiconductor layer 131, a switching gate electrode 152, a switching source electrode 173, and a switching drain electrode 174. The driving thin film transistor 20 includes a driving semiconductor layer 132, a driving gate electrode 155, a driving source electrode 176, and a driving drain electrode 177.

The capacitor 80 includes a first capacitive plate 158, a second capacitive plate 178, and an interlayer insulating layer 160 interposed therebetween. Herein, the interlayer insulating layer 160 becomes a dielectric material. The capacitance of the capacitor 80 is determined by charges accumulated in the capacitor 80, and a voltage between the first and second capacitive plates 158 and 178.

The switching thin film transistor 10 is used to turn on a corresponding OLED 70. The switching gate electrode 152 is connected to the gate line 151. The switching source electrode 173 is connected to the data line 171. The switching drain electrode 174 is spaced apart from the switching source electrode 173 and is connected to the first capacitive plate 158.

The driving thin film transistor 20 applies a voltage to the pixel electrode 710, to drive an organic emission layer 720. The driving gate electrode 155 is connected to the first capacitive plate 158. The driving source electrode 176 and the second capacitive plate 178 are connected to the common power line 172. The driving drain electrode 177 is connected to the pixel electrode 710, through a contact hole 182.

The switching thin film transistor 10 is driven by a gate voltage applied to the gate line 151, so as to transmit a data voltage applied to the data line 171 to the driving thin film transistor 20. A voltage difference, between a common voltage transmitted from the common power line 172 to the driving thin film transistor 20 and the data voltage transmitted from the switching thin film transistor 10, is stored in the capacitor 80. A current corresponding to the voltage stored in the capacitor 80 flows to the OLED 70, through the driving thin film transistor 20, so that the OLED 70 emits light.

In at least one pixel area an electrode cut 735 is formed, by cutting of the common electrode 730. The electrode cut 735 surrounds an opening of a pixel defining layer 190 of the corresponding pixel area. That is, in a pixel area where the electrode cut 735 is formed, a portion of the common electrode 730 formed on the pixel electrode 710 is electrically disconnected, i.e., is electrically isolated from the rest of the common electrode 730. Accordingly, an organic emission layer 720, in the pixel area where the electrode cut 735 is formed, cannot emit light.

Hereinafter, the structure of a pixel area having the electrode cut 735, according to the first exemplary embodiment of the present invention, will be described in further detail. The structure of a thin film transistor, particularly, the structure of the driving thin film transistor 20, will also be described. The description of the switching thin film transistor 10 will focus on differences with the driving thin film transistor.

A substrate 110 is formed of an insulating material, such as glass, quarts, ceramic, plastic, or the like. However, the present invention is not limited thereto. The substrate 110 may be formed of a metallic substrate, such as stainless steel, for example. The substrate 110 includes a plurality of pixel areas.

A buffer layer 120 is formed on the substrate 110. The buffer layer 120 blocks impurities and planarizes the substrate 110. The buffer layer 120 can be made of various materials, for example, silicon nitride (SiNx), silicon dioxide (SiO2), and/or silicon oxynitride (SiOxNy). However, the buffer layer 120 can be omitted, in accordance with the type and process conditions of the substrate 110.

A driving semiconductor layer 132 is formed on the buffer layer 120. The driving semiconductor layer 132 is generally formed of a polysilicon layer. The driving semiconductor layer 132 includes a channel region 135, in which impurities are not doped. The driving semiconductor layer 132 also includes a source region 136 and a drain region 137, at respective sides of the channel region 135, which are doped with a dopant. The dopant can be a P-type impurity that includes boron (B), such as B2H6. Herein, the impurity can be changed, in accordance with the type of the thin film transistor.

In the first exemplary embodiment of the present invention, a PMOS-structured thin film transistor, using the P-type impurity, is used as the driving thin film transistor 20, but the present invention is not limited thereto. For example, a NMOS-structured thin film transistor, or a CMOS-structured thin film transistor, can be used as the driving thin film transistor 20. In addition, although the driving film transistor 20 of FIG. 2 is a polycrystalline thin film transistor including a polysilicon layer, the switching thin film transistor 10 (not shown in FIG. 2) may be a polycrystalline thin film transistor, or an amorphous thin film transistor including an amorphous silicon layer.

The gate insulation layer 140, which can be made of silicon nitride (SiNx) or silicon dioxide (SiO2), is formed on the driving semiconductor layer 132. A gate wire including the driving gate electrode 155 is formed on the gate insulating layer 140. The gate wire further includes the gate line 151, a first capacitive plate 158, and/or other wires. In addition, the driving gate electrode 155 overlaps at least a part of the driving semiconductor layer 132, and particularly, overlaps the channel region 135.

The interlayer insulation layer 160, which covers the driving gate electrode 155, is formed on the gate insulating layer 140. The gate insulating layer 140 and the interlayer insulating layer 160 have through-holes that expose the source region 136 and the drain region 137 of the driving semiconductor layer 132. The interlayer insulating layer 160 can be made of silicon nitride (SiNx) or silicon dioxide (SiO2).

A data wire, including the driving source electrode 176 and the driving drain electrode 177, is formed on the interlayer insulating layer 160. The data wire further includes the data line 171 (FIG. 1), the common power line 172, the second capacitive plate 178, and/or other wires. The driving source electrode 176 and the driving drain electrode 177 are respectively connected to the source region 136 and the drain region 137 of the driving semiconductor layer 132, through the through-holes.

As described, the driving thin film transistor 20, including the driving semiconductor layer 132, the gate electrode 155, the driving source electrode 176, and the driving drain electrode 177, is formed. The configuration of the driving thin film transistor 20 is not limited to the above-described exemplary embodiment, and can be variously modified.

A planarization layer 180, which covers the data wires 172, 176, 177, and 178, is formed on the interlayer insulating layer 160. The planarization layer 180 increases the luminous efficiency of the OLED 70. The planarization layer 180 has a contact hole 182, through which the drain electrode 177 is exposed. The planarization layer 180 can be made of at least one of a polyacrylate resin, an epoxy resin, a phenolic resin, a polyamide resin, a polyimide resin, an unsaturated polyester resin, a poly phenylenether resin, a poly phenylenesulfide resin, and benzocyclobutene (BCB). The first exemplary embodiment of the present invention is not limited to the above-described structure, for example, one of the planarization layer 180 and the interlayer insulating layer 160 may be omitted, if necessary.

The pixel electrode 710 of the OLED 70 is formed on the planarization layer 180. That is, each of the plurality of pixel areas of the OLED display 100 includes a plurality of pixel electrodes 710 that are spaced from each other. The pixel electrode 710 is connected to the drain electrode 177, through the contact hole 182 of the planarization layer 180.

A pixel defining layer 190, having an opening that exposes the pixel electrode 710, is formed on the planarization layer 180. That is, the pixel electrode 710 is disposed to correspond to the opening of the pixel defining layer 190. However, the pixel electrode 710 may be disposed under the pixel defining layer 190, so as to overlap the pixel defining layer 190. The pixel defining layer 190 can be made of an inorganic material, a resin, or silica-base material, such as a polyacrylate resin, a polyimide, or the like.

The organic emission layer 720 is formed on the pixel electrode 710, and the common electrode 730 is formed on the organic emission layer 720. Thus, the OLED 70, including the pixel electrode 710, the organic emission layer 720, and the common electrode 730, is completed.

The organic emission layer 720 can be made of a low molecular weight organic material or a high molecular weight organic material. Such an organic emission layer 720 has a multi-layer structure, including a hole injection layer (HIL), a hole transport layer (HTL), an emission layer, an electron transport layer (ETL), and an electron injection layer (EIL). The HIL is formed on the pixel electrode 710 which is a positive electrode, and the HTL, the ETL, and the EIL are sequentially stacked thereon.

One of the pixel electrode 710 and the common electrode 730 can be made of a transparent conductive material, and the other can be made of a transflective, or reflective, conductive material. According to materials of the pixel electrode 710 and the common electrode 730, the OLED display 100 can be classified as a top light-emitting type, a bottom light-emitting type, or a dual-side light-emitting type.

For the transparent conductive material, indium tin oxide (ITO), indium zinc oxide (IZO), zinc oxide (ZnO), or indium oxide (In2O3) can be used. For the reflective material, lithium (Li), calcium (Ca), fluorinated lithium/calcium (LiF/Ca), fluorinated lithium/aluminum (LiF/Al), aluminum (Al), silver (Ag), magnesium (Mg), or gold (Au) can be used.

The electrode cut 735 is formed by cutting the common electrode 730, so as to electrically isolate a portion of the common electrode 730. The electrode cut 735 surrounds the opening of the pixel defining layer 190. That is, the electrode cut 735 is formed in the common electrode 730, on the pixel defining layer 190. Electrode cuts 735 can be form around pixel areas having an abnormal OLED 70.

As described, a portion of the common electrode 730, which is disposed in the electrode cut 735, is electrically disconnected from the rest of the common electrode 730. Therefore, the electrode cut 735 deactivates the corresponding OLED 70, by electrically isolating the associated emission layer.

When electrode cut 735 is formed, a channel 195 may also be formed in the pixel defining layer 190, along the electrode cut 735. The electrode cut 735 and/or channel 195 may formed by a laser. The channel 195 can be omitted, however.

Since the electrode cut 735 is formed on the pixel defining layer 190, the pixel defining layer 190 is interposed between the electrode cut 735 and the pixel electrode 710. Therefore, the pixel defining layer 190 protects the pixel electrode 710 from being damaged, when the electrode cut 735 is formed, by cutting the common electrode 730 with the laser.

The data wires (the data line 171, the common power line 172, the source electrode 176, and the drain electrode 177) may be disposed under the electrode cut 735. However, the pixel defining layer 190 protects the data wires, during the formation of the electrode cut 735. With the above-described configuration, the OLED display 100 allows for a bright spot failure to be stably changed to a black spot, so that the display quality of the OLED display 100 can be maintained.

Figure 3:
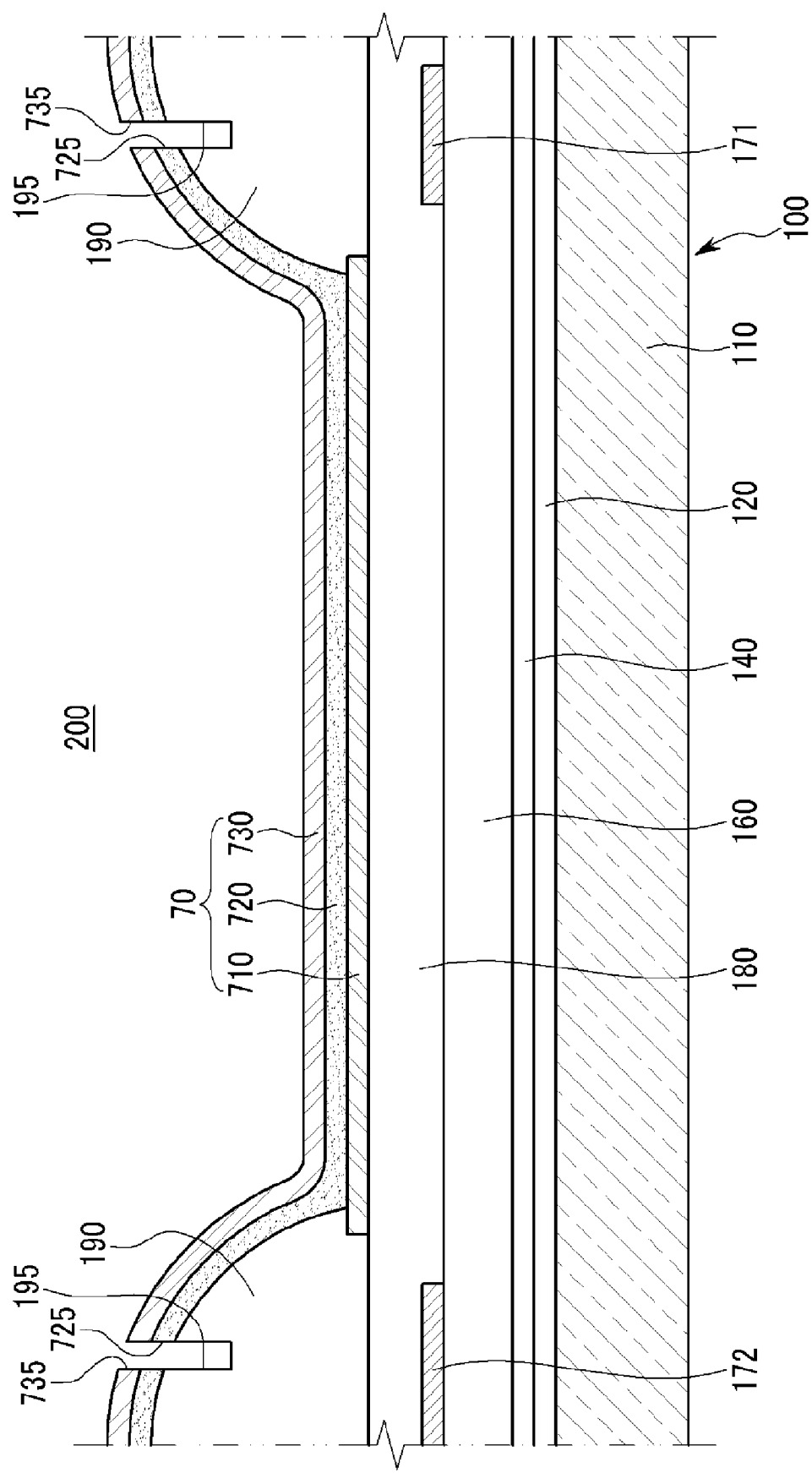
FIG. 3 is a cross-sectional view of an OLED display taken along line III-III of FIG. 1, according to a second exemplary embodiment of the present invention.

Referring to FIG. 3, a second exemplary embodiment of the present invention will now be described. As shown in FIG. 3, an organic emission layer 720 is interposed between a pixel defining layer 190 and a common electrode 730. The organic emission layer 720 may include an emission layer and several other layers, such as a hole injection layer (HIL), a hole transport layer (HTL), an electron transport layer (ETL), and an electron injection layer (EIL). In this case, the layers excluding the emission layer (HTL, HIL, ETL, and EIL) are formed on the pixel electrode 710 and the pixel defining layer 190, by using an open mask manufacturing process. That is, among the several layers included in the organic emission layer 720, at least one layer is interposed between the pixel electrode 190 and the common electrode 730.

In addition, in a pixel area where an electrode cut 735 is formed, an organic layer cut 725 is formed by cutting a portion of the organic emission layer 720, which is interposed between the pixel defining layer 190 and the common electrode 730. The organic layer cut 725 extends along an electrode cut 735. The organic layer cut 725 also surrounds an opening of the pixel defining layer 190.

As described, a portion of the organic emission layer 720 is electrically disconnected from the rest of the organic emission layer 720 disposed in a neighboring pixel areas, by the organic layer cut 725. Therefore, the portion of organic emission layer 720, of an OLED 70 in a pixel area where the electrode cut 735 and the organic layer cut 725 are formed, does not emit light.

With the above-described configuration, in an OLED display 200, a pixel area where a bright spot failure occurs is more stably changed to a black spot, so as to enhance display quality. When only a portion of the common electrode 730 is disconnected by the electrode cut 735, a small amount of current may flow through the organic emission layer 720. However, current flow through the organic emission layer 720 can be completely blocked, by forming the organic layer cut 725. Accordingly, a pixel having a defective OLED 70 can be reliably changed to a black spot.

A manufacturing method of the OLED display of FIG. 3 will be described with reference to FIG. 4. The thin film transistor 20 and the capacitor 80 are formed on a substrate 110 including pixel areas, and then the planarization layer 180 is formed thereon. A pixel electrode 710 is formed in each pixel area, on the planarization layer 180.

A pixel defining layer 190, having openings that expose the pixel electrodes 710, is formed on the planarization layer 180. The organic emission layer 720 and the common electrode 730 are formed on each pixel electrode 710, to complete the OLEDs 70. Herein, the organic emission layers 720 and the common electrodes 730 are formed on the pixel electrodes 710 and the pixel defining layers 190. However, the organic emission layers 720 may be formed only in the openings of the pixel defining layers 190 (i.e., only on the pixel electrode 710).

A defective OLED 70 is found by examining OLEDs 70. A defective OLED 70 continuously emits light, without regard to the data signal and the gate signal.

Figure 4:
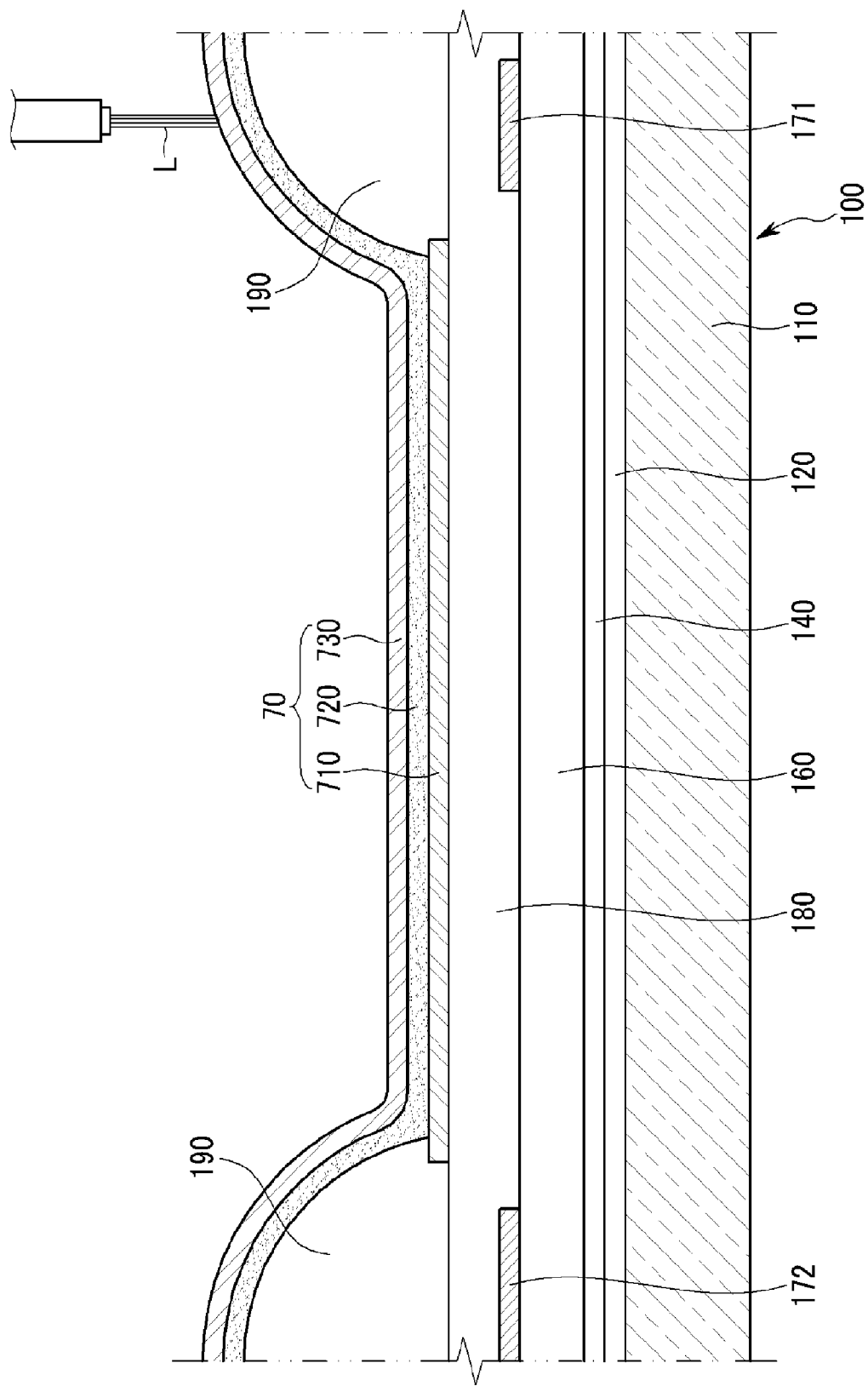
FIG. 4 is a cross-sectional view of a method for manufacturing the OLED of FIG. 3.

Next, as shown in FIG. 4, the organic emission layer 720 and the organic layer cut 725 are formed, by respectively cutting the common electrode 730 and the organic emission layer 720 with a laser L, in the pixel area where the defective OLED 70 is disposed. Here, the electrode cut 735 and the organic layer cut 725 are formed on the pixel defining layer 190, and surround the opening of the pixel defining layer 190. The channel 195 of the pixel defining layer 190 is formed together with the electrode cut 735 and the organic layer cutting layer 725. However, when the organic emission layer 720 is not disposed on the pixel defining layer 190, only the electrode cut 735 and the channel 195 may be formed.

As described, a common electrode 730 and an organic emission layer 720 of an OLED 70 are electrically disconnected from a common electrode 730 and an organic emission layer 720 of a neighboring OLED 70, by the electrode cut 735 and the organic layer cut 725. Therefore, an organic emission layer 720 of a defective OLED 70 cannot emit light. Accordingly, the pixel area where the defective OLED 70 is disposed is changed to a black spot.

According to the above-described manufacturing method, a pixel area where a bright spot failure occurs is stably changed to a black spot, so as to maintain the display quality of the OLED display 200.

Although a few exemplary embodiments of the present invention have been shown and described, it would be appreciated by those skilled in the art that changes may be made in these exemplary embodiments, without departing from the principles and spirit of the invention, the scope of which is defined in the claims and their equivalents.

What is claimed is:

1. An organic light emitting diode (OLED) display device comprising:
   a substrate; pixel electrodes disposed on the substrate;
   a pixel defining layer disposed on the substrate, having openings that expose the pixel electrodes;
   an organic emission layer disposed on the pixel electrodes; and
   a common electrode disposed on the organic emission layer and the pixel defining layer, wherein an electrode cut is formed in the common electrode, around one of the openings of the pixel defining layer, to electrically isolate a portion of the common electrode.

2. The OLED display device of claim 1, wherein the electrode cut is formed on the pixel defining layer.

3. The OLED display device of claim 2, wherein the pixel defining layer comprises a channel that corresponds to the electrode cut.

4. The OLED display device of claim 2, wherein the pixel defining layer extends between the electrode cut and the pixel electrode.

5. The OLED display device of claim 2, further comprising:
   a data line, a common power line, a source electrode, and a drain electrode,
   wherein at least one of the data line, the common power line, the source electrode, and the drain electrode is disposed between the electrode cut and the substrate.

6. The OLED display device of claim 1, wherein an organic emission layer disposed within the electrode cut does not emit light.

7. The OLED display device of claim 1, wherein the organic emission layer is further formed between the pixel defining layer and the common electrode, and an organic layer cut is formed by cutting the organic emission layer along the electrode cut on the pixel area where the electrode cut is formed.

8. A method for manufacturing an organic light emitting diode (OLED) display device, comprising:
   forming pixel electrodes on a substrate;
   forming a pixel defining layer on the substrate, the pixel defining layer having openings that respectively expose the pixel electrodes;
   forming an organic emission layer on the pixel electrodes;
   forming a common electrode on the organic emission layer, so as to form completed OLEDs;
   detecting a defective one of the OLEDs; and
   forming an electrode cut in the common electrode, which surrounds one of the openings that corresponds to the defective OLED, to electrically isolate a portion of the common electrode.

9. The manufacturing method of claim 8, wherein the electrode cut is formed on the pixel defining layer.

10. The manufacturing method of claim 9, wherein the forming of the electrode cut includes forming a channel together with the electrode cut by concaving a pixel defining layer disposed under the electrode cut.

11. The manufacturing method of claim 9, wherein the pixel defining layer is interposed between the electrode cut and the pixel electrode.

12. The manufacturing method of claim 9, further comprising forming a data line, a common power line, a source electrode, and a drain electrode,
   wherein at least one of the data line, the common power line, the source electrode, and the drain electrode is disposed between the electrode cut and the substrate.

13. The manufacturing method of claim 8, wherein the defective OLED device does not emit light.

14. The manufacturing method of claim 8, wherein:
   the forming of the organic emission layer comprises forming the organic emission layer between the pixel defining layer and the common electrode; and
   the forming of the electrode cut comprises forming a cut in the organic emission layer that corresponds to the electrode cut.

15. An organic light emitting diode (OLED) display device comprising:
   a substrate;
   pixel electrodes disposed on the substrate;
   a pixel defining layer disposed on the substrate, having openings that expose the pixel electrodes;
   an organic emission layer disposed on the pixel electrodes; and
   a common electrode disposed on the organic emission layer and the pixel defining layer,
   wherein a cut is formed in the common electrode and the organic emission layer, to electrically isolate a portion of the common electrode and a corresponding portion of the organic emission layer, so as to deactivate an OLED of the display device, with the cut surrounding an opening of the pixel defining layer.

16. The OLED display device of claim 15, wherein a channel corresponding to the cut is formed in the pixel defining layer.

17. A method for manufacturing an organic light emitting diode (OLED) display device including OLEDs each having a pixel electrode, a pixel defining layer that comprises openings each exposing the respective pixel electrode, and a common electrode that is electrically connected to the OLEDs, the method comprising:
   detecting a defective one of the OLEDs;
   forming an electrode cut in the common electrode to deactivate the defective OLED, by electrically isolating a portion of the common electrode, with the electrode cut surrounding the opening of the pixel defining layer corresponding to the defective OLED; and
   forming an organic emission layer cut through an organic emission layer of the display device, with the organic emission layer cut being adjacent to the electrode cut.

18. The method of claim 17, further comprising forming a channel in a pixel defining layer of the display device, with the channel being adjacent to the organic emission layer cut.

19. An OLED display device manufactured by the method of claim 17, further comprising:
   a substrate;
   a plurality of pixel electrodes disposed on the substrate;
   a pixel defining layer disposed on the substrate, having a plurality of openings that expose the pixel electrodes;
   an organic emission layer disposed on the pixel electrodes;
   the defective one of the OLEDs does not emit light; and
   the electrode cut formed in the common electrode electrically isolating a corresponding portion of the common electrode, and the organic emission layer cut formed in the organic emission layer, electrically isolating a corresponding portion of the organic emission layer.

* * * * *